United States Patent [19]
Kitajima et al.

[11] Patent Number: 4,733,370
[45] Date of Patent: Mar. 22, 1988

[54] INFORMATION HOLDING DEVICE

[75] Inventors: Masaaki Kitajima, Hitachiohta; Hideaki Kawakami, Mito; Yoshiharu Nagae, Hitachi; Masahiro Takasaka, Hitachiohta, all of Japan

[73] Assignee: Hitachi, Ltd., Tokyo, Japan

[21] Appl. No.: 73,359

[22] Filed: Jul. 8, 1987

Related U.S. Application Data
[63] Continuation of Ser. No. 613,620, May 24, 1984.

[30] Foreign Application Priority Data

May 25, 1983 [JP] Japan ................... 58-90716

[51] Int. Cl.$^4$ .................. G11C 11/24; G11C 11/42
[52] U.S. Cl. ................................. 365/149; 365/108
[58] Field of Search ............... 365/108, 149; 361/277, 361/327

[56] References Cited

U.S. PATENT DOCUMENTS
3,118,133  1/1964  Meeker et al. .................. 365/149
3,703,331  11/1972 Goldmacher et al. .......... 365/108
3,796,999  3/1974  Kohn .................................. 365/108
3,967,253  6/1976  Tsuruishi ........................... 365/234
4,196,974  4/1980  Hareng et al. ..................... 350/346
4,221,471  9/1980  Gurtler ............................. 350/331 R

FOREIGN PATENT DOCUMENTS
0103170  3/1984  European Pat. Off. ........... 365/108
0117535  9/1984  European Pat. Off. ........... 365/108

Primary Examiner—Terrell W. Fears
Attorney, Agent, or Firm—Antonelli, Terry & Wands

[57] ABSTRACT

An information holding device comprising a pair of substrates whose opposing surfaces are formed with electrodes on one side and electrodes on the other side so that they may oppose and that opposing parts between the electrodes on the one side and those on the other side may form a matrix as a whole, a dielectric which is held between said pair of substrates, means to change a capacitance of the dielectric in any desired one of the opposing parts, and detection means to simultaneously detect the capacitances of at least two of the opposing parts between the electrodes on the one side and those on the other side.

10 Claims, 32 Drawing Figures

INFORMATION HOLDING DEVICE

This application is a continuation of application Ser. No. 613,620, filed May 24, 1984.

BACKGROUND OF THE INVENTION

The present invention relates to an information holding device, and more particularly to an information holding device capable of outputting stored information to an external device.

In the past, a device made of a liquid crystal having a smectic phase with a display function and an information holding function and a device made of a dielectric material such as PLZT have been known as the information holding devices. Hereinbelow, a liquid crystal device having the display function and the information holding function will be explained as an example of the information holding device.

The liquid crystal devices of various display principles including a liquid crystal having a nematic phase, a liquid crystal having a cholesteric phase or a liquid crystal having a smectic phase have been known. In those devices, the orientations of liquid crystal molecules are changed by an external field and the resulting change of an optical property is used to display the information.

As an example of such liquid crystal devices, a thermal writing type liquid crystal device disclosed in U.S. Pat. No. 3,796,999 "Locally Erasable Thermo-Optic Smectic Liquid Crystal Storage Displays" will be outlined below.

In the disclosed device, transparent electrodes 13 and 14 are arranged on the inner surfaces of a pair of glass substrates 11 and 12 as shown in FIG. 1(a), and the space between them is filled with a liquid crystal 15 having a smectic phase. A laser beam 16 emitted from an Ar (argon) laser or a YAG (yttrium-aluminum-garnet) laser is focused on the display panel through a lens 17 to heat the smectic liquid crystal 15 of an area 18 to be displayed, thereby rendering it an isotropic liquid crystal phase once.

Then, the laser beam is removed to quickly cool the liquid crystal to the smectic phase. As a result, the orientations of the liquid crystal molecules are disturbed and a region 19 which exhibits a strong scattering property is produced as shown in FIG. 1(b). Since this scattered state persists stably, a desired image information can be stored.

Based on the display principle described above, the thermal writing type display device can write a desired image information on the liquid crystal elements by the scan and the modulation of the laser beam, and local erasure is attained by the application of an electric field. Thus, it is perferable as a display device, but it does not have a function to read out the stored image information and it is merely used as a display device for inputting an information signal as an image.

The other known liquid crystal devices (e.g., U.S. Pat. No. 4,196,974) also have only the function of displaying the image and they are not used as the information output devices.

SUMMARY OF THE INVENTION

An object of the present invention is to eliminate the disadvantages described above, and to provide an information holding device capable of inputting/outputting an information signal in such a way that an information holding device made of a dielectric such as a liquid crystal having a smectic phase is endowed with the function of reading out information in a short time.

A feature of the present invention for accomplishing the second object consists in comprising a pair of substrates whose opposing surfaces are formed with electrodes on one side and electrodes on the other side so that they may oppose and that opposing parts between the electrodes on the one side and those on the other side may form a matrix as a whole, a dielectric which is held between said pair of substrates, means to change a capacitance of the dielectric in any desired one of the opposing parts, and detection means to simultaneously detect the capacitances of at least two of the opposing parts between the electrodes on the one side and the other side.

Here, the "dielectric" indicates a dielectric whose capacitance is changed by applying an electric field, heat or the like and is stored without any change for a fixed time even after the electric field, the heat or the like has been removed. For example, a liquid crystal having a smectic phase, a liquid crystal having a cholesteric phase, PLZT, etc. are mentioned. It is preferable to use the liquid crystal having the smectic phase which can write information at a comparatively low temperature and whose storage time is long.

In a preferable aspect of performance of the present invention, the pair of substrates are formed with M electrodes on one side and N electrodes on the other side which oppose to each other, and the detection means is means to simultaneously detect the capacitances of the opposing parts between one electrode on the one side and any desired K ($2 \leq K \leq N$) electrodes on the other side.

In a further preferable aspect of performance of the present invention, the pair of substrates are formed with M electrodes on one side and N electrodes on the other side which oppose to each other, the M electrodes on the one side are divided into blocks each of which includes a plurality of electrodes electrically connected.

In a still further preferable aspect of performance of the present invention, the detection means is constructed of means to apply a time-varying voltage to the dielectric of at least two of the opposing parts, and means to simultaneously detect principally displacement currents flowing through the dielectric of the at least two opposing parts.

In a yet further preferable aspect of performance of the present invention, the means to detect the displacement currents comprises current-to-voltage converter circuits which convert the displacement currents into voltages, and capacitance discriminating circuits which are constructed of comparators for comparing the voltages with a reference voltage $V_{ref}$.

Other objects and features of the present invention will become apparent from the following description of embodiments.

DESCRIPTION OF THE PREFERRED EMBODIMENTS

Hereinbelow, the present invention will be described in detail by taking as an example a liquid crystal having a smectic A phase.

EMBODIMENT 1

Figure 1A:
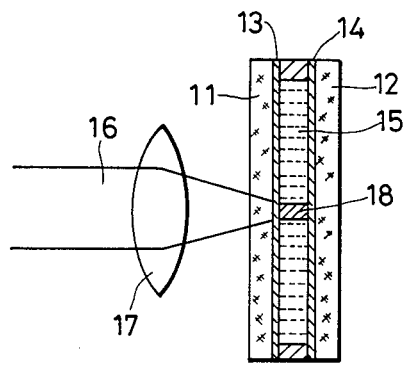
FIGS. 1a and 1b are views showing a liquid crystal display device in a prior art.
Figure 1B:
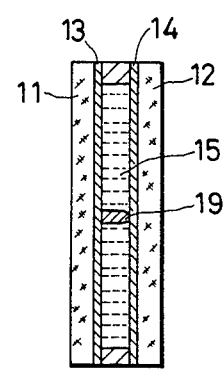
Figure 2:
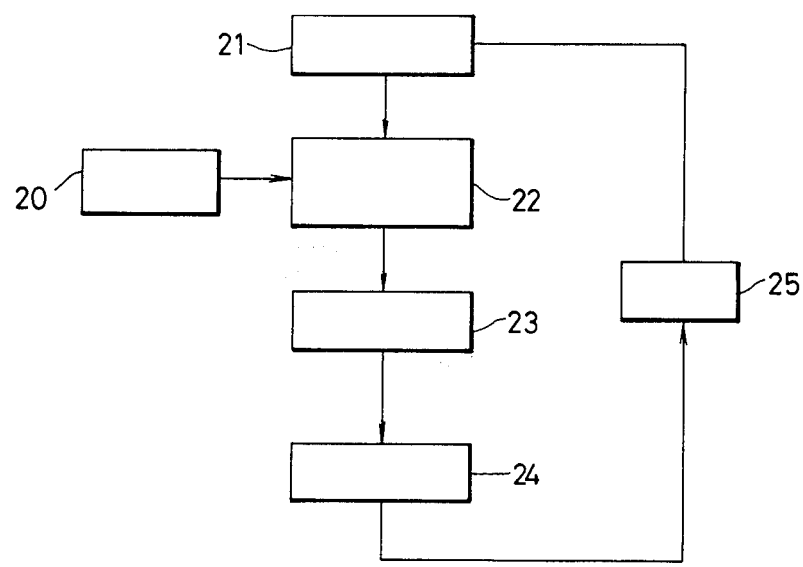
FIG. 2 is a block diagram of the whole device of an embodiment of the present invention.

FIG. 2 shows a diagram of the general arrangement of a liquid crystal device according to an embodiment of the present invention.

Picture information writing means 21 is means for changing the capacitance of a liquid crystal having a smectic A phase as serves as the dielectric of the opposing part between one electrode and the other electrode of substrates, thereby to write picture information such as characters and symbols into a liquid crystal panel 22. The picture information written in the liquid crystal panel 22 is read out by a picture information reading voltage generator circuit 20 which generates a voltage varying with time to be applied to the liquid crystal in the opposing part of the electrodes, and a picture information detector circuit 23 which detects principally a displacement current flowing through the dielectric of the opposing part of the electrodes. The picture information read out is sent to a picture signal converter circuit 24. A picture information signal produced here is fed into an external circuit 25 which is composed of, for example, a microprocessor (CPU).

Figure 3:
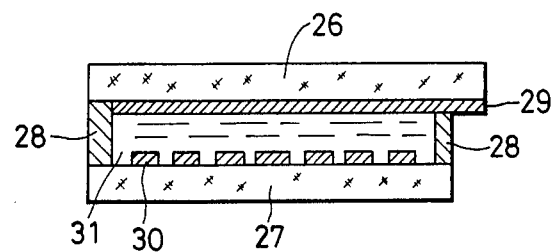
FIGS. 3 and 4 are structural views of a liquid crystal panel for use in the embodiment of the present invention.
Figure 4:
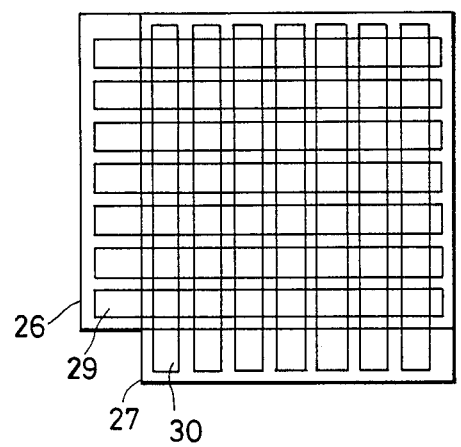

Next, the arrangements and operations of the respective portions will be described. A schematic sectional view of the liquid crystal panel 22 is shown in FIG. 3, while a schematic plan view is shown in FIG. 4. In the liquid crystal panel, a gap of about 10 μm is defined between a pair of substrates 26 and 27 which have a plurality of Y-electrodes 29 and a plurality of X-electrodes 30 juxtaposed on their opposing surfaces in a manner to intersect each other, and a liquid crystal 31 having a smectic A phase is contained between the substrates and is sealed by a spacer 28. Here, the opposing parts between the Y-electrodes 29 and the X-electrodes 30 become picture elements and form a matrix as a whole.

The substrates 26 and 27 may be glass plates or plastic plates, or the non-viewing substrate may be an opaque substrate such as a Si-substrate and the viewing substrate may be a transparent substrate such as a glass plate or a plastic plate.

The electrodes may be transparent conductive films such as of a mixture of indium oxide and tin oxide, usually called "nesa films", or the electrode on the viewing substrate may be the nesa film and the other electrode may be a metal such as Al or Cr.

The liquid crystal material may be a mixture of substances generally expressed by

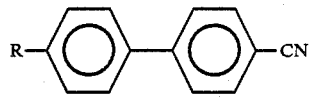

(where R is an alkali radical) which exhibit a positive dielectric anisotropy and the smectic A phase at room temperatures and changes from the smectic phase to a nematic phase at 42° C. and from the nematic phase to an isotropic liquid phase at 45° C.

Other liquid crystals having the smectic A phase are a mixture of 4, 4' alchoxy biphenyl carboxylic acid alkyl ester and 4, 4' alkyl cyanotran and a mixture of 4-alchoxy phenyl-4'-alkyl benzoic acid ester and p,p'-alkyl cyano biphenyl.

When dichronic dye is added to the liquid crystal, a viewing angle property of display is improved and it is desirable to the display device.

Figure 5:
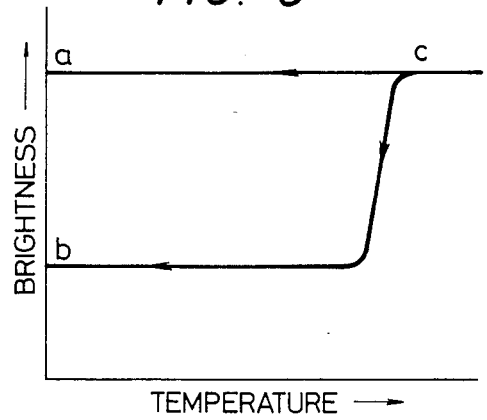
FIG. 5 is a temperature characteristic diagram of a liquid crystal for use in the embodiment of the present invention.

FIG. 5 shows an optical characteristic of the liquid crystal having the smectic phase. When the liquid crystal having the smectic phase is heated, it is changed into an isotropic liquid phase (point c) via the nematic phase and becomes an essentially transparent state. Here, when the liquid crystal layer is cooled while a sufficient voltage is applied thereto, it becomes a smectic phase (point a) via the nematic phase and an essentially transparent state, and this state is retained.

On the other hand, when the voltage applied to the liquid crystal layer is set to or around zero volt, liquid crystal molecules are oriented at random with respect to the substrates, so that the liquid crystal layer exhibits a smectic phase having a scattering property (point b) and a brightness is reduced. This state is retained thereafter.

The present inventors have acknowledged that when the voltage applied to the liquid crystal layer having the nematic phase is changed in the course of cooling of the liquid crystal layer, the amount of scatter changes so that a tonality can be imparted to the display. The inventors have also acknowledged that the capacitance of such liquid crystal having the smectic phase does not substantially change for several days to several months after the electric field or the heat has been removed.

Interfaces between the electrodes 29 and 30 and the liquid crystal 31 having the smectic phase are treated with a silane surface active agent so that they are homeotropically oriented, that is, the liquid crystal molecules having the smectic phase are oriented in a direction perpendicularly to the substrates, although they may be oriented in a direction parallel to the substrates.

The liquid crystal material is not limited to the liquid crystal having the smectic phase, but it may be other liquid crystal such as a liquid crystal having a cholesteric phase whose orientation is changed by the application of an external field and retained for a predetermined time period after the external field has been removed.

EMBODIMENT 2

Figure 6:
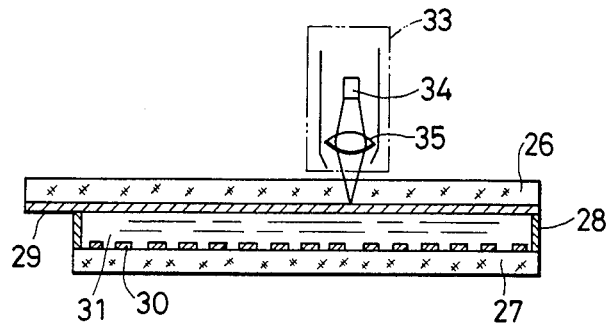
FIGS. 6 to 12 are diagrams showing embodiments of picture information writing.
Figure 7:
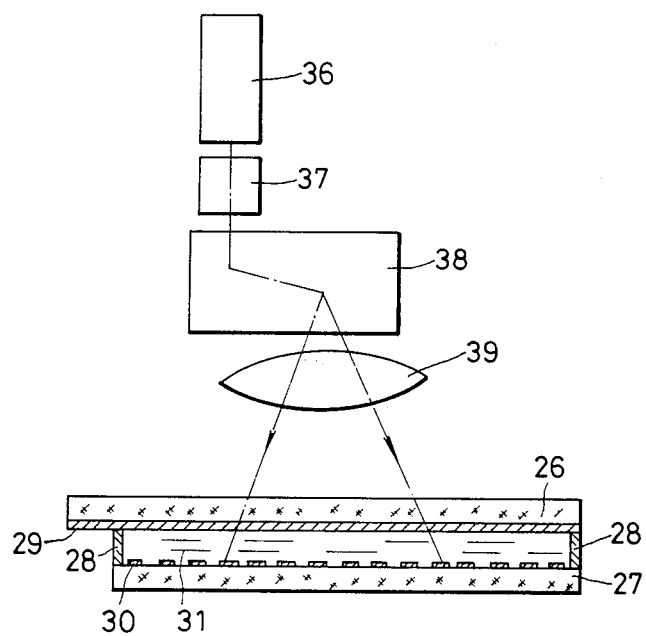

Next, the picture information writing means 21 will be described. FIGS. 6 and 7 show means for writing picture information by projecting a laser beam on the liquid crystal panel which employs the liquid crystal having the smectic phase.

The means of FIG. 6 is provided with a laser pen 33 which can condense the laser beam on any desired position. The laser pen 33 to be used is, for example, one which is constructed of an optical fiber for guiding the laser beam from a light source and a condensing lens, or one in which a semiconductor laser 34 and a condensing lens 35 are made unitary. The inventors have experimentally confirmed that the writing of picture information can be achieved by condensing laser power which is at least 10 mW on the surface of the liquid crystal element.

EMBODIMENT 3

FIG. 7 shows another picture information writing means. It is constructed of a laser 36, a modulator 37 which modulates the laser beam, a deflector 38 for the X-direction and the Y-direction which deflects the laser beam in any desired direction, and a lens 39 which condenses the laser beam on the surface of the liquid crystal element.

The laser 36 which the inventors use is, for example, a YAG laser whose power is 1 W in the single mode and whose beam spread angle is within 1 mrad.

An acoustooptic modulator is employed as the modulator 37. By way of example, a plane mirror (galvanometer) whose angle can be controlled by the quantity of current is used as the deflector 38.

In either system, the laser beam is absorbed by the electrodes 29 or the electrodes 30, and the electrodes are heated. As a result, the liquid crystal having the smectic phase is also heated to change into the isotropic liquid phase. When the laser beam is subsequently removed, the liquid crystal is rapidly cooled to change into the smectic phase again via the nematic phase. At this time, the orientation direction of the liquid crystal molecules is disordered, and the liquid crystal scatters external light and falls into a "write" state because this scattered state continues to exist stably. Further, the part of the liquid crystal not irradiated with the laser beam exhibits the initial state ("non-write" stage) and is in the transparent state.

In bringing the whole area of the liquid crystal panel into the initial state (unwrite state), the purpose can be attained in such a way that a D.C. voltage or A.C. voltage is applied across the Y-electrodes 29 and X-electrodes 30 after the whole area of the liquid crystal panel has been heated or that a sufficiently high D.C. voltage or A.C. voltage is applied without heating.

EMBODIMENT 4

Figure 8:
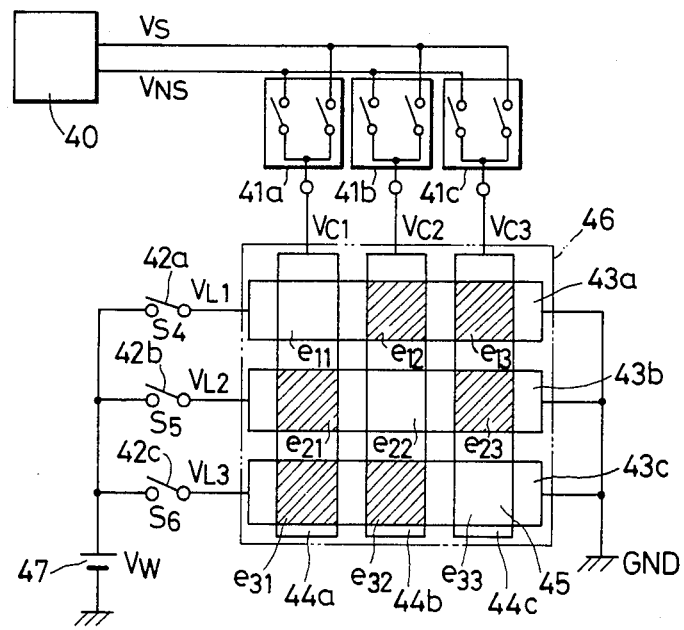

Next, another embodiment of the picture information writing means for the liquid crystal panel which employs the liquid crystal having the smectic phase is illustrated in FIG. 8.

The structure of the liquid crystal panel 46 is the same as that of the liquid crystal panel shown in FIG. 4. Switches 42a–42c are connected to the terminals on one side, of Y-electrodes 43a–43c formed on one substrate, while the terminals thereof on the other side are connected to GND (0 V).

Further, switch pairs 41a–41c are connected to X-electrodes 44a–44c formed on the other substrate.

A heating power source 47 is connected to the switches 42a–42c, while a driver circuit 40 is connected to the switch pairs 41a–41c. The driver circuit 40 produces a selecting voltage $V_S$ and a nonselecting voltage $V_{NS}$, and $V_S < V_{NS}$ (in effective values) is held.

Figure 9:
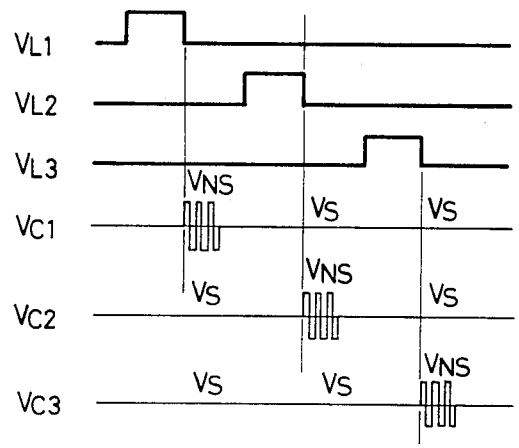

$V_S$ is a voltage to the extent of allowing the liquid crystal to change from (the point c) to (the point b) in the characteristic shown in FIG. 5, and it is set at or near 0 V in the present embodiment. Besides, $V_{NS}$ is a voltage to the extent of allowing the liquid crystal to change from (the point c) to (the point a) in the characteristic shown in FIG. 5. Not only pulse waves as shown in FIG. 9, but also sinusoidal waves, intermittent pulses etc. are selected. However, A.C. voltages whose average values become 0 V are desirable for preventing the deterioration of the liquid crystal.

Here, in a case where, among the picture elements of the liquid crystal panel 46, hatched ones $e_{12}$, $e_{13}$, $e_{21}$, $e_{23}$, $e_{31}$ and $e_{32}$ are assumed to be in the write state (scattering state) and the others $e_{11}$, $e_{22}$ and $e_{33}$ in the non-write state (transparent state), voltages shown in FIG. 9 are applied to the X-electrodes 44a–44c and the Y-electrodes 43a–43c.

In the state in which all the switch pairs 41a–41c are turned "off", the switch 42a is turned "on" for a fixed time so as to apply a heating voltage $V_W$ to the Y-electrode 43a. As a result, the Y-electrode 43a generates heat, and the liquid crystal is heated by the Joule heat to change from the smectic phase into the isotropic liquid phase.

Subsequently, when the switch 42a is turned "off" to remove the heating voltage $V_W$, the liquid crystal cools rapidly. At this time, only one switch of the switch pair 41a is turned "on" so as to choose and deliver the non-selecting voltage $V_{NS}$. The remaining switch pairs 41b and 41c choose and deliver the selecting voltage $V_S$ ($\approx 0$). As a result, the hatched picture elements $e_{12}$ and $e_{13}$ fall into the write state, and the picture element $e_{11}$ falls into the non-write state.

The operations stated above are similarly performed as to the Y-electrodes 43b and 43c in succession.

As will be described later, the picture elements of a plurality of rows may well be selected at the same time.

EMBODIMENT 5

Figure 10:
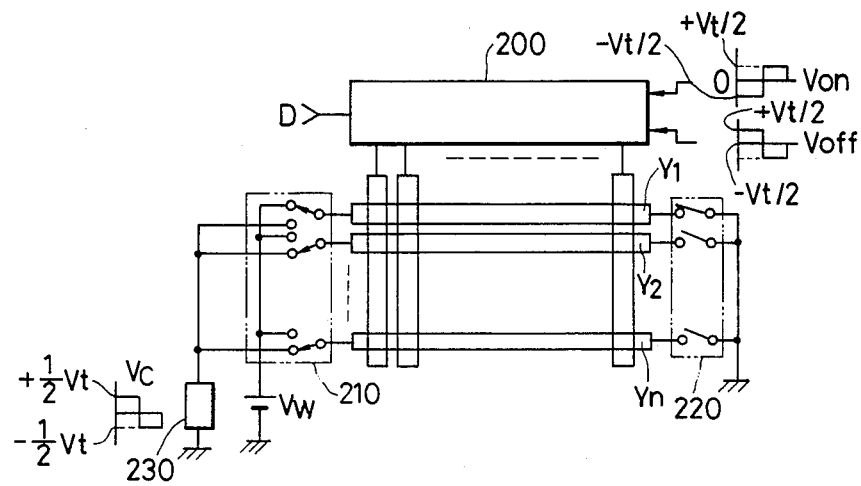
Figure 11:
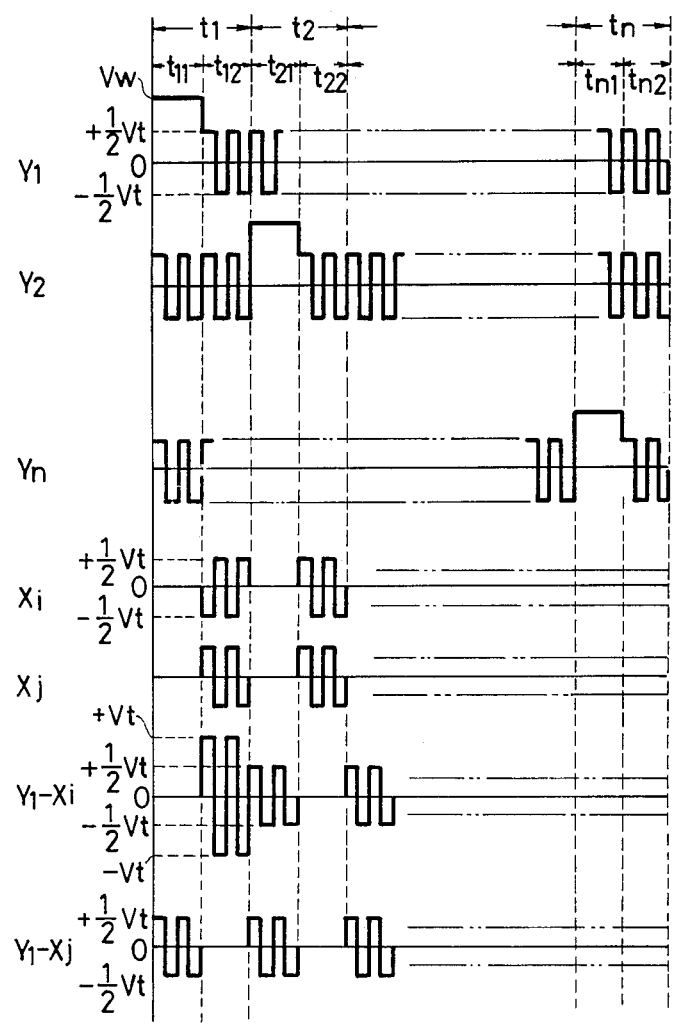

FIG. 10 shows another embodiment of the means for writing picture information, while FIG. 11 is a diagram showing the operating timings thereof.

In FIG. 10, numeral 200 designates an X-electrode driver circuit, and numeral 210 a Y-electrode driver circuit. The circuit 210 consists of two-channel switching elements which change-over a voltage generating source $V_w$ for heating the Y-electrodes. In addition, numeral 220 indicates switching elements which turn "on" only when the switches of the circuit 210 have selected the heating voltage source $V_w$.

In the present embodiment, voltages as shown in FIG. 11 are applied to the left terminal parts of the Y-electrodes $Y_1, Y_2, \ldots Y_n$ by the circuits 210 and 220. In the periods of time $t_1, t_2, \ldots t_n$, the switching elements select the heating voltage source $V_w$ in the first halves and an A.C. voltage generating source 230 in the latter halves. First, in the period of time $t_1$ for selecting $Y_1$, one of the switching elements in the circuit 220 corresponding to the selected row electrode turn "on" in the first half $t_{11}$ thereof. Accordingly, the Y-electrode produces heat, and the state of the liquid crystal changes into the isotropic liquid phase via the nematic phase. Next, in the latter half $t_{12}$, the switch of the circuit 210 is changed-over to the A.C. voltage source $V_c$, while at the same time the switch of the circuit 220 is turned "off". Simultaneously, a signal of either of $V_{on}$ and $V_{off}$ which have amplitudes of $\pm \frac{1}{2} V_t$ corresponding to input data signals D and whose phases are opposite to each other is applied from the side of the X-electrode driver circuit 200. Thenceforth, the operations are similarly repeated to sequentially scan the electrodes $Y_2, Y_3, \ldots Y_n$. Accordingly, A.C. electric fields which are impressed on the liquid crystal become as shown by $Y_1-X_i$ and $Y_1-X_j$ in FIG. 11. That is, the display state of the liquid crystal layer is determined by the state of the electric field application in the case of the cooling thereof during $t_{12}, t_{22}, \ldots t_{n2}$. In the present embodiment, the non-selected Y-electrode is normally supplied with the A.C. voltage of $\pm \frac{1}{2} V_t$. Since, however, the non-selected Y-electrode is not heated, the change of the display state does not take place.

Figure 12:
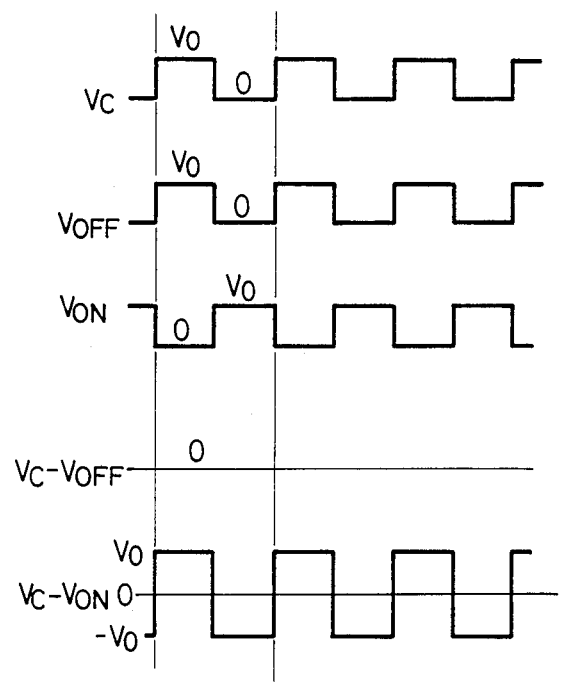

While, in the present embodiment, the voltage waveform of $\pm \frac{1}{2} V_t$ has been employed for each of the A.C. voltages of the X- and Y-electrodes, quite the same effect is attained even when a single voltage source has been employed as illustrated in FIG. 12.

EMBODIMENT 6

Next, the principle of a method of reading out picture information will be described.

As stated before, the liquid crystal having the smectic phase for use in the present embodiment exhibits the positive dielectric anisotropy. That is, the relationship between the specific inductivity $\epsilon_{\parallel}$ in the major axis direction of the liquid crystal molecules and the specific inductivity $\epsilon_{\perp}$ in the minor axis direction is $\epsilon_{\parallel} > \epsilon_{\perp}$.

In the non-write state thus far described, accordingly, the liquid crystal molecules are oriented perpendicularly to the electrodes, and the specific inductivity of the liquid crystal layer is approximately equal to the specific inductivity $\epsilon_{\parallel}$ in the major axis direction of the liquid crystal molecules.

Besides, in the write state, the orientation direction of the liquid crystal molecules is conspicuously disordered. Assuming that the orientation direction be completely random, the specific inductivity of the liquid crystal layer becomes close to the three-dimensional average value $\frac{1}{3}(\epsilon_{\parallel} + 2\epsilon_{\perp})$ of the specific inductivity in the major axis $\epsilon_{\parallel}$ and the specific inductivity in the minor axis direction $\epsilon_{\perp}$ of the liquid crystal molecules, and it is a value smaller than $\epsilon_{\parallel}$.

Figure 13:
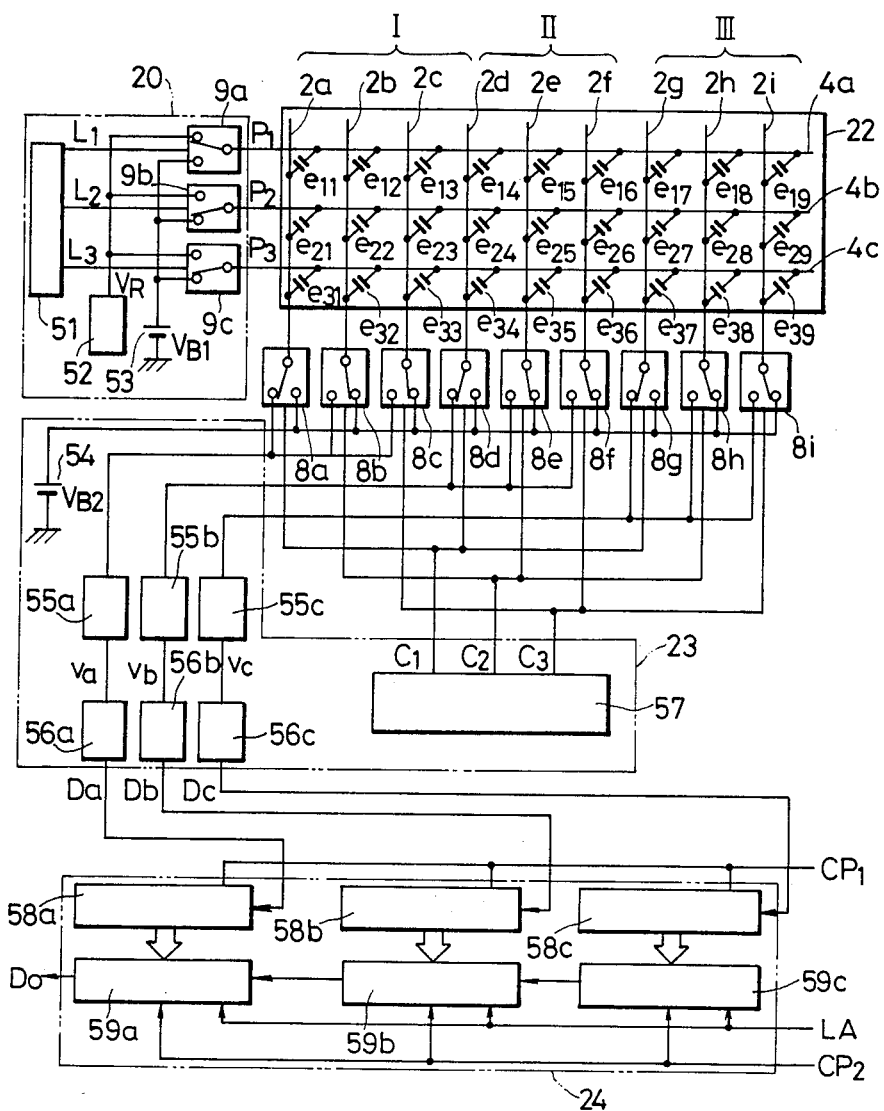
FIGS. 13 to 15, 16A, 16B, 16C and 17 are diagrams showing embodiments of picture information reading operations.

Here, when the picture elements $e_{11}-e_{33}$ arranged in the shape of the matrix as shown in FIG. 8 are considered as a kind of capacitors, the liquid crystal panel 46 can be deemed a group of capacitors 48 as shown in FIG. 13.

Since, at this time, the respective picture elements are filled with the liquid crystal layer being the dielectric between the electrodes, their capacitances differ owing to the unequal dielectric constants caused by the different molecular orientations between in the write state and in the non-write state as described before.

Accordingly, the capacitance $C_W$ of the picture element in the write state and that $C_{NW}$ of the picture element in the non-write state differ. In the case of the foregoing example where the liquid crystal material having the positive dielectric anisotropy is employed and is perpendicularly oriented in the non-write state, $C_W < C_{NW}$ holds, and the ratio becomes:

$$\frac{C_{NW}}{C_W} = \frac{\epsilon_{\parallel}}{\frac{1}{3}(\epsilon_{\parallel} + 2\epsilon_{\perp})} > 1 \tag{1}$$

The inventors measured the capacitances by the use of a liquid crystal material of $\epsilon_{\parallel} = 12$ and $\epsilon_{\perp} = 4.7$. As a result, it has been confirmed that $C_{NW}/C_W = 1.48$ holds, which is a value close to a value 1.68 calculated in accordance with Equation (1).

Besides, in a case where the liquid crystal material having the positive dielectric anisotropy is used and where the initial orientation is rendered the horizontal orientation, $C_W > C_{NW}$ holds.

As stated above, the picture element in the write state and that in the non-write state have unequal capacitances. By electrically reading out the difference of the capacitances, therefore, the written information can be recognized and outputted to an external device.

There will now be explained embodiments of the picture information reading voltage generator circuit 20, the picture information detector circuit 23 and the picture information signal converter circuit 24 which are shown in FIG. 2.

FIG. 13 shows one embodiment of the picture information reading method. The liquid crystal panel 22 is such that picture elements $e_{11}-e_{39}$ are expressed by the equivalent circuit of capacitors. Electrodes consist of X-electrodes 2a–2i and Y-electrodes 4a–4c.

Selection switches 9a–9c apply a capacitance reading voltage $V_R$ or a voltage $V_{B1}$ stable with time, depending upon control signals $L_1-L_3$ from a scanning circuit 51.

It is assumed here that, among the picture elements, those $e_{11}$, $e_{14}$ and $e_{17}$ have their picture information read out simultaneously. To this end, the Y-electrode 4a is supplied with the reading voltage $V_R$ of a voltage source circuit 52 in the picture information reading voltage generator circuit 20. The other Y-electrodes 4b and 4c is supplied with the voltage $V_{B1}$ stable-with-time which is the output of a constant voltage source 53.

In addition, selection switches 8a–8i are connected to the X-electrodes 2a–2i. One terminal of each of these selection switches is connected to a constant voltage source 54 which generates a constant voltage $V_{B2}$. The other terminals of the selection switches 8a–8c, 8d–8f and 8g–8i are connected in common, and the respective common connections are connected to current-to-voltage converter circuits 55a–55c.

Further, capacitance discriminating circuits 56a–56c are respectively connected to the current-to-voltage converter circuits 55a–55c. Information signals $D_a-D_c$ obtained here are respectively applied to shift registers 58a–58c, the outputs of which are respectively applied to shift registers 59a–59c.

The selection switches 8a–8i either apply the constant voltage $V_{B2}$ to the respective X-electrodes 2a–2i or deliver currents flowing through the respective X-electrodes 2a–2i, in accordance with control signals $C_1-C_3$ from a selection circuit 57.

In FIG. 13, the X-electrodes 2a, 2d and 2g are respectively connected to the current-to-voltage converter circuits 55a, 55b and 55c, and the other X-electrodes 2b, 2c, 2e, 2f, 2h and 2i are connected to the constant voltage source 54.

The present embodiment of such arrangement is characterized in that the switches for selecting the currents flowing through the electrodes are divided into a plurality of blocks (in FIG. 13, three blocks I, II and III).

The present embodiment is also characterized in that principally displacement currents in the currents flowing through the picture elements $e_{11}$–$e_{39}$ have their magnitudes discriminated so as to detect capacitances.

Figure 14:
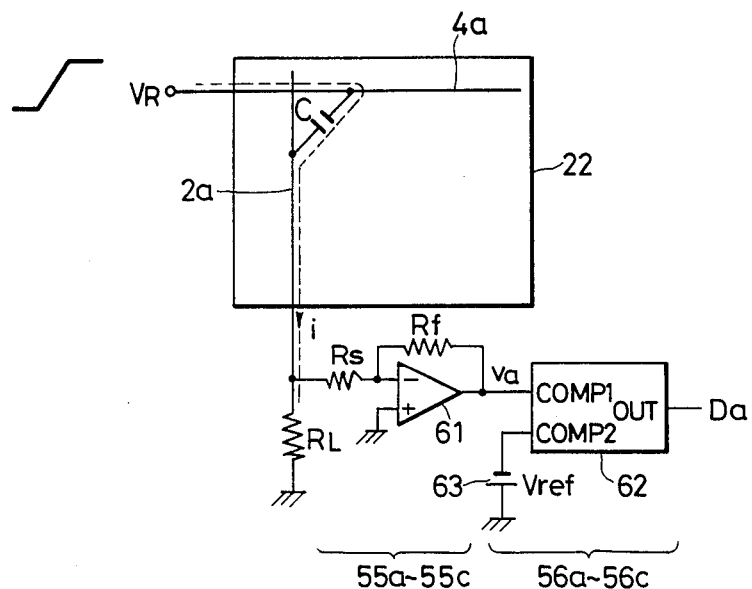
Figure 15:
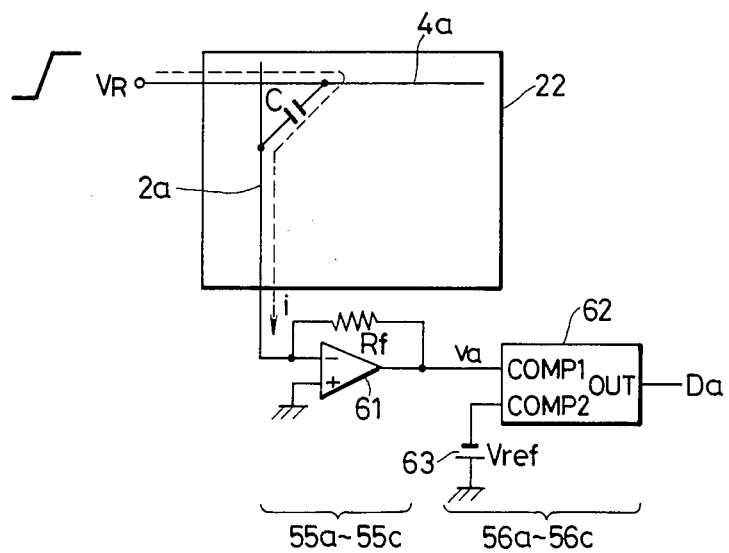

FIGS. 14 and 15 show practicable examples of the current-to-voltage converter circuits $55a$–$55c$ and the capacitance discriminating circuits $56a$–$56c$. Further, FIGS. 16(a) to 16(c) show voltage waveforms in various parts of FIGS. 14 and 15.

Referring to FIGS. 14 and 15, when the picture element is regarded as a capacitance C and the reading voltage is applied to the electrode $4a$, a displacement current i flows through the electrode $2a$.

Figure 16A:
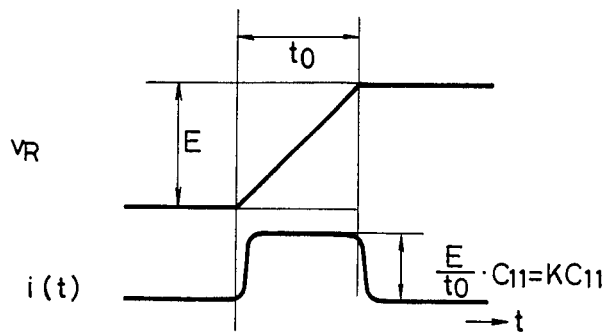
Figure 16B:
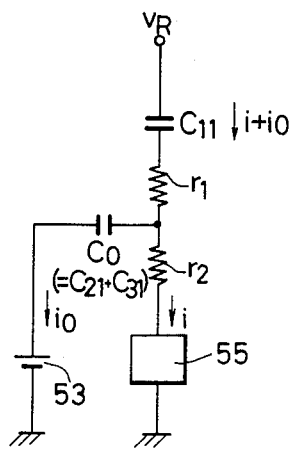
Figure 16C:
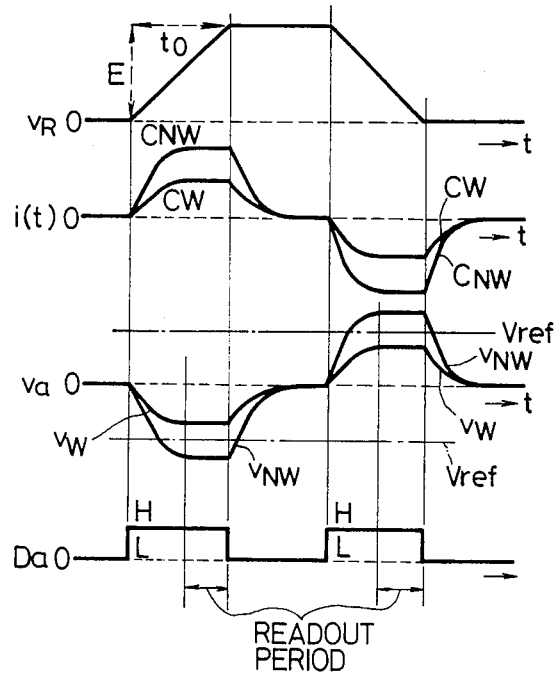

FIGS. 16(a) to 16(c) show the situation at the time at which the capacitance of the picture element $e_{11}$ is read out. Here, the capacitances of the picture elements $e_{11}$, $e_{21}$ and $e_{31}$ are denoted by $C_{11}$, $C_{21}$ and $C_{31}$ respectively.

It is assumed by way of example that the reading voltage $V_R$ be a ramp voltage of $dV/dt = E/t_o = K$ as shown in FIG. 16(a), and that a wiring resistance $r_1$ and a wiring resistance $r_2$ be sufficiently small. Then, the displacement current i flowing to the current-to-voltage converter circuit 55 is saturated to a value of $K \cdot C_{11}$ in a short time.

Now, assuming $C_0 = C_{21} + C_{31}$ in FIG. 16(b), the following holds:

$$\begin{cases} \frac{1}{C_{11}} \int (i + i_o)dt + r_1(i + i_o) + r_2 i = Kt & (2) \\ \frac{i}{r_2} = \frac{1}{C_o} \int i_o \, dt & (3) \end{cases}$$

The displacement current i(t) is evaluated by the La place transform etc. from Equations (2) and (3), as follows:

$$i(t) = K \cdot C_{11} \left( 1 - \frac{\beta \epsilon^{\alpha t} - \alpha \epsilon^{\beta t}}{\beta - \alpha} \right) \quad (4)$$

Here, putting $$A = r_1 r_2 C_0, \quad B = r_1 + r_2 + \frac{r_2 C_0}{C_{11}}$$

then the following holds:

$$\alpha = \frac{-\frac{B}{A} + \sqrt{\left(\frac{B}{A}\right)^2 - \left(\frac{4}{C_{11}A}\right)}}{2} < 0 \quad (5)$$

$$\beta = \frac{-\frac{B}{A} - \sqrt{\left(\frac{B}{A}\right)^2 - \left(\frac{4}{C_{11}A}\right)}}{2} < 0 \quad (6)$$

From Equation (4), $i(t=0)=0$ and $i(t=\infty)=K \cdot C_{11}$. It is understood that the displacement current i at the saturation becomes $K \cdot C_{11}$, does not depend upon the other capacitance $C_0$ ($=C_{21}+C_{31}$) or the wiring resistances $r_1$ and $r_2$ of the electrode and is not affected by a current due to crosstalk.

As shown in FIG. 16(c), accordingly, the detection of the displacement current i makes it possible to detect the capacitance $C_W$ of the picture element in the write state and the capacitance $C_{NW}$ of the picture element in the non-write state, and the picture information can be read out in a short time.

Although the picture information may well be read out by detecting the displacement current i in the transition state, it enhances the detection accuracy more to detect the displacement current i after being saturated and stabilized as shown in FIG. 16(c).

Further, the detection of the displacement current i may be performed during either the rise or the fall of the reading voltage $V_R$.

Even when the "reading voltage $V_R$ varying with time" is, for example, a sinusoidal wave voltage other than the voltage whose dV/dt is constant ($=K$), the capacitance can be detected. As understood from Equation (4), however, the detection is easier when dV/dt is constant ($=K$). As such voltages of constant dV/dt, a triangular wave voltage etc. are mentioned besides the ramp voltage as illustrated in FIG. 16(c).

The orientation state of the liquid crystal molecules changes when a voltage not lower than a specified threshold value has been applied. Therefore, the reading voltage $V_R$ which is applied for detecting the capacitance should preferably be set at a voltage value less than the threshold value of the liquid crystal.

The current-to-voltage converter circuit $55a$–$55c$ converts the aforementioned displacement current i into a voltage, and is constructed of an operational amplifier 61 and resistors.

Besides, the capacitance discriminating circuit $56a$–$56c$ is constructed of a comparator 62 and compares the output $v_a$ of the operational amplifier with a reference voltage $V_{ref}$ generated by a reference voltage source 63.

Here, as shown in FIG. 16(c), the output $v_a$ of the operational amplifier 61 becomes $v_w$ when the picture element is in the write state and $v_{nw}$ when in the non-write state. Therefore, when the voltages $v_a$ and $V_{ref}$ are compared by the comparator, the output $D_a$ of the comparator becomes an "H" level in the write state and an "L" level in the non-write state.

Figure 17:
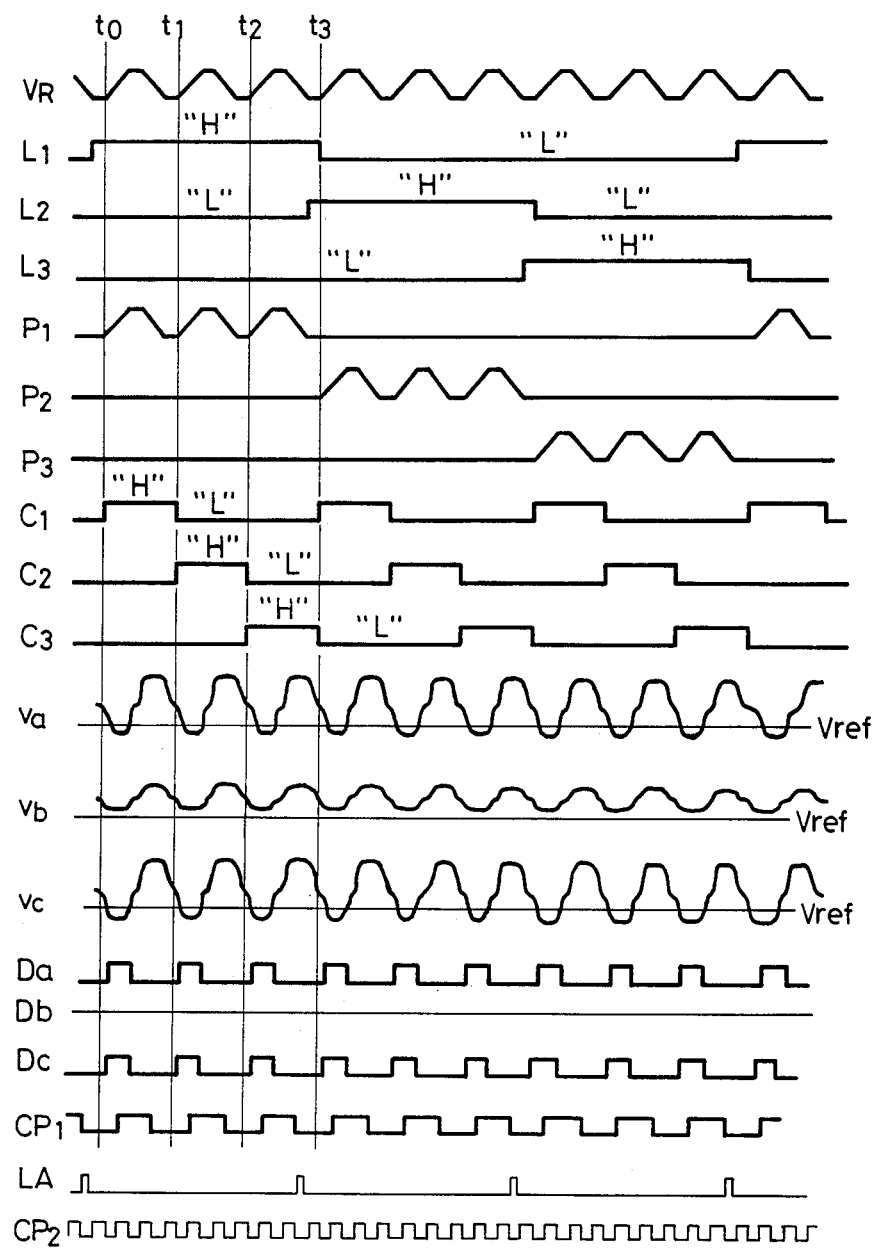

Next, the operation of the circuit shown in FIG. 13 will be described with reference to FIG. 17. It is assumed that the picture elements $e_{11}$, $e_{12}$, $e_{13}$, $e_{17}$, $e_{18}$, $e_{19}$, $e_{21}$, $e_{22}$, $e_{23}$, $e_{27}$, $e_{28}$, $e_{29}$, $e_{31}$, $e_{32}$, $e_{33}$, $e_{37}$, $e_{38}$ and $e_{39}$ of the blocks I and III be in the non-write state, whereas the picture elements $e_{14}$, $e_{15}$, $e_{16}$, $e_{24}$, $e_{25}$, $e_{26}$, $e_{34}$, $e_{35}$ and $e_{36}$ of the block II be in the write state.

Now, the selector switches $9a$–$9c$ are assumed to select the reading voltage $V_R$ when the control signals $L_1$–$L_3$ applied thereto are at the "H" level. Then, the Y-electrodes $4a$–$4c$ are successively supplied with three clocks of the reading voltage.

On the other hand, the selector switches $8a$–$8i$ are assumed to provide the current detector circuits $14a$–$14c$ with the displacement currents i flowing through the X-electrodes $2a$–$2i$, when the control signals $C_1$–$C_3$ applied thereto are at the "H" level. Then, the current-to-voltage converter circuit $55a$ is supplied with the displacement currents of the picture elements of the block I. Further, the current-to-voltage converter circuit $55b$ is supplied with the displacement currents of the picture elements of the block II, and the current-to-voltage converter circuit $55c$ with the displacement currents of the picture elements of the block III.

For example, the operation in a period of time $t_0$–$t_3$ will be observed. In a period $t_0$–$t_1$, the magnitude of the output $v_a$ of the current-to-voltage converter circuit $55a$ is determined by the capacitance of the picture element $e_{11}$. Further, the magnitude of the output $v_b$ of the current-to-voltage converter circuit 55b is simultaneously determined by the capacitance of the picture element $e_{14}$, and that of the output $v_c$ of the current-to-voltage converter circuit 14c is simultaneously determined by the capacitance of the picture element $e_{17}$.

That is, the capacitances of the three picture elements $e_{11}$, $e_{14}$ and $e_{17}$ are detected at the same time.

Likewise, in a period $t_1-t_2$, the magnitudes of the outputs $v_a$, $v_b$ and $v_c$ are simultaneously determined by the magnitudes of the capacitances of the picture elements $e_{12}$, $e_{15}$ and $e_{18}$ respectively. Further, in a period $t_2-t_3$, they are simultaneously determined by the magnitudes of the capacitances of the picture elements $e_{13}$, $e_{16}$ and $e_{19}$ respectively.

When the outputs $v_a-v_c$ of the respective current-to-voltage converter circuits obtained as above described are applied to the capacitance discriminating circuits 56a-56c, picture information signals $D_a-D_c$ are produced.

After the picture information signals $D_a-D_c$ are fed into the shift registers 58a-58c in synchronism with a clock signal $CP_1$, the outputs of the shift registers 58a-58c are simultaneously applied to the corresponding shift registers 59a-59c at the timing of a latch signal LA.

The operations above described are repeated three times.

Meanwhile, by endowing the shift registers 59a-59c with the shifting function, the output $D_0$ of the shift register 59a becomes values determined by the capacitances of the respective picture elements in the sequence of $e_{11} \ldots e_{19}$, $e_{21} \ldots e_{29}$, and $e_{31} \ldots e_{39}$ in synchronism with a clock signal $CP_2$.

The reading operation can be rendered higher in speed by reading out the picture elements in block unit in this manner.

While, in the embodiment of FIG. 13, the picture elements have been divided into the three blocks so as to simultaneously detect the capacitances of the three rows of picture elements, they may well be divided into two blocks or into four, five, . . . blocks.

EMBODIMENT 7

Figure 18:
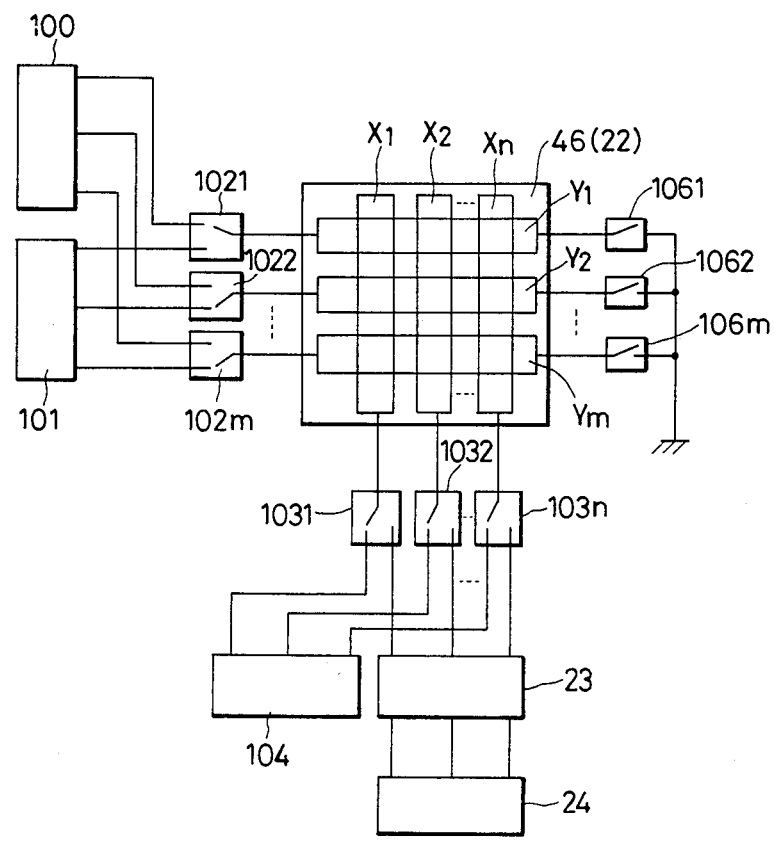
FIG. 18 is a diagram showing an embodiment in which the writing and reading of information are unitarily combined.

FIG. 18 shows an embodiment in which the information writing and reading circuits thus far described are made unitary.

Selector switches $103_1-103_n$ are connected to the X-electrodes $X_1, X_2, \ldots X_n$. An X-electrode driving circuit 104 is connected to one input terminal of each of the selector switches, while the picture information detector circuit 23 and the picture signal converter circuit 24 are connected to the other input terminals of the selector switches through selector switches (not shown).

Selector switches $102_1-102_m$ are connected to the ends of the Y-electrodes $Y_1, Y_2, \ldots Y_m$ on one side. A Y-electrode driving circuit 100 is connected to one input terminal of each of the selector switches, while a picture information reading voltage-generator circuit 101 is connected to the other input terminal.

Further, switches $106_1-106_m$ are connected to the ends of the Y-electrodes $Y_1, Y_2, \ldots Y_m$ on the other side.

Here, when picture information is to be written, the selector switches $102_1-102_m$ select the Y-electrode driving circuit 100, while the selector switches $103_1-103_n$ select the X-electrode driving circuit 104.

In the present embodiment, the writing with a laser beam can be jointly employed. All the switches $106_1-106_m$ are brought into the "off" state for the writing with the laser beam shown in FIG. 6 or 7, and all the switches are brought into the "on" state for the writing based on the heat generation of electrodes shown in FIG. 8.

On the other hand, when information is to be read out, the selector switches $102_1-102_m$ and $103_1-103_n$ select the capacitance reading voltage-generator circuit 101 and the picture information detector circuit 105, respectively. At this time, the switches $106_1-106_m$ are brought into the "off" state.

According to the present embodiment, it becomes possible that any desired picture is written into and displayed on a liquid crystal panel from an external circuit on the basis of the heat generation of electrodes, that an observer or user supplements, revises or deletes information with a laser pen at will, and that the information is read out to be delivered to an external circuit.

EMBODIMENT 8

Figure 19:
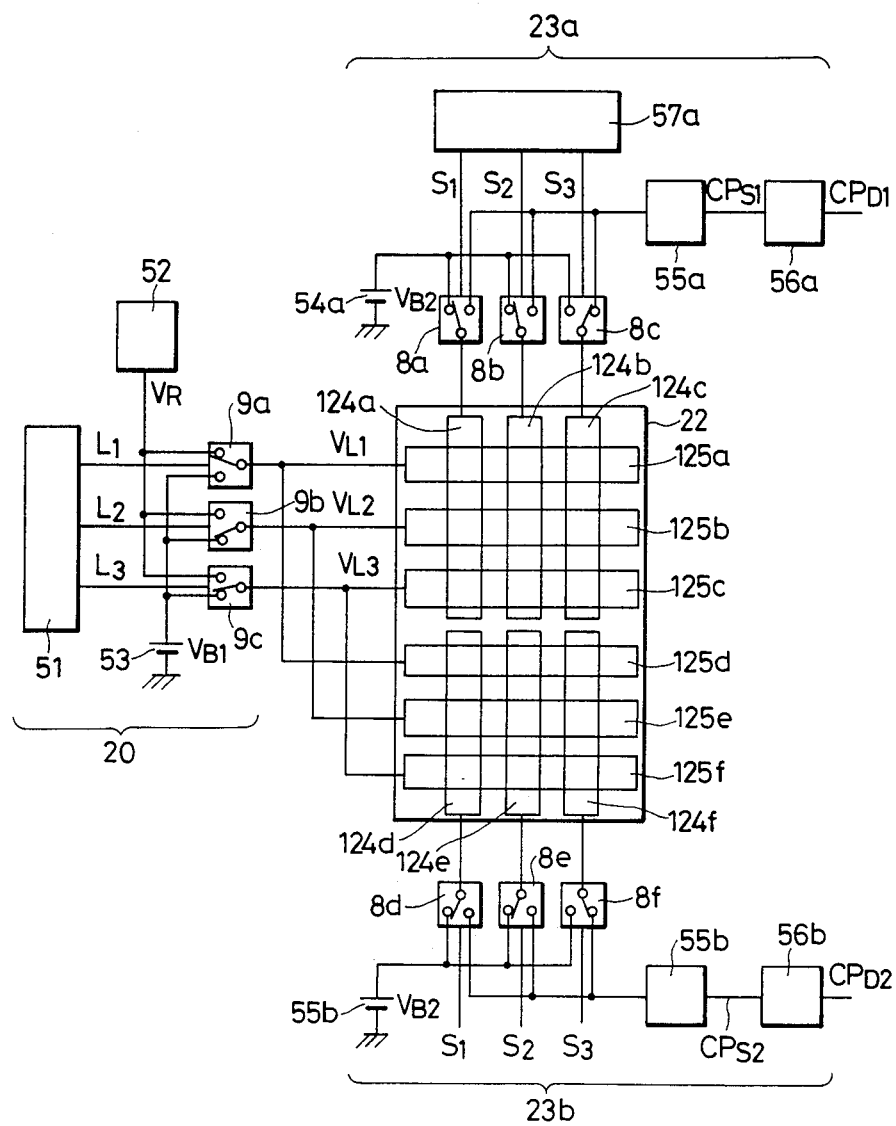
FIGS. 19 to 21 are diagrams showing other embodiments of picture information reading operations.

FIG. 19 shows another embodiment of picture information reading.

The electrodes 124 of the liquid crystal panel 22 on the other side (hereinbelow, called "X-electrodes") are divided into two blocks, and the electrodes 125 on one side (hereinbelow, called "Y-electrodes") in two rows are connected in common outside or inside the panel, whereby the capacitances of two rows of picture elements are simultaneously detected.

The read-out scanning circuit 20 is constructed of selector switches 9a-9c, a voltage source circuit 52 for generating a reading voltage $V_R$, a horizontal scanning circuit 51, and a constant voltage source 53 for providing a voltage $V_{B1}$ stable with time (including 0 V).

On the other hand, a picture information detector circuit 23a is constructed of selector switches 8a-8c, a vertical scanning circuit 57a, a constant voltage source 54a for providing a voltage $V_{B2}$ stable with time, a current-to-voltage converter circuit 55a, and a capacitance discriminating circuit 56a formed of a comparator.

Further, a picture information detector circuit 23b has the same construction as that of the aforementioned picture information detector circuit 23a.

Figure 20:
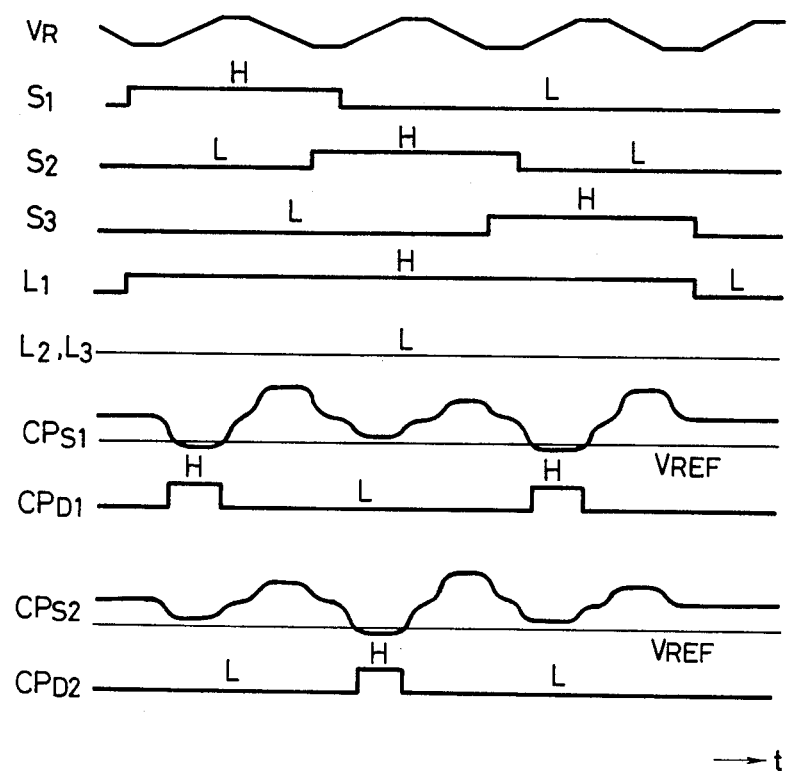

FIG. 20 shows operations in FIG. 19 as a time chart. Here will be explained the operations in the case of selecting the Y-electrodes 125a and 125d at the same time.

To this end, a control signal $L_1$ from the horizontal scanning circuit 51 is set at an "H" level and control signals $L_2$ and $L_3$ are set at an "L" level, to apply the reading voltage $V_R$ to the Y-electrodes 125a, 125d and the bias voltage $V_{B1}$ to the other Y-electrodes 125b, 125c, 125e, 125f.

On the other hand, control signals $S_1-S_3$ from the vertical scanning circuit 57a are successively rendered the "H" level, to successively supply the current-to-voltage converter circuits 55a, 55b with displacement currents flowing through the X-electrodes.

By comparing the resulting signals $CP_{S1}$, $CP_{S2}$ with a reference voltage $V_{REF}$, picture information signals $CP_{D1}$ and $CP_{D2}$ are obtained.

Although no illustration is made in the drawing, the signals $CP_{D1}$ and $CP_{D2}$ can be fed into an external circuit by passing them through, for example, shift registers similarly to the illustration of FIG. 13.

By simultaneously applying the reading voltage $V_R$ to the two Y-electrodes in this fashion, it is permitted to read out the capacitances of the two rows of picture elements. Moreover, since the X-electrodes are divided into the two blocks to reduce the wiring resistance of the electrodes and thus quicken the response of the displacement currents, the fast reading of the capacitances is further facilitated.

EMBODIMENT 9

Figure 21:
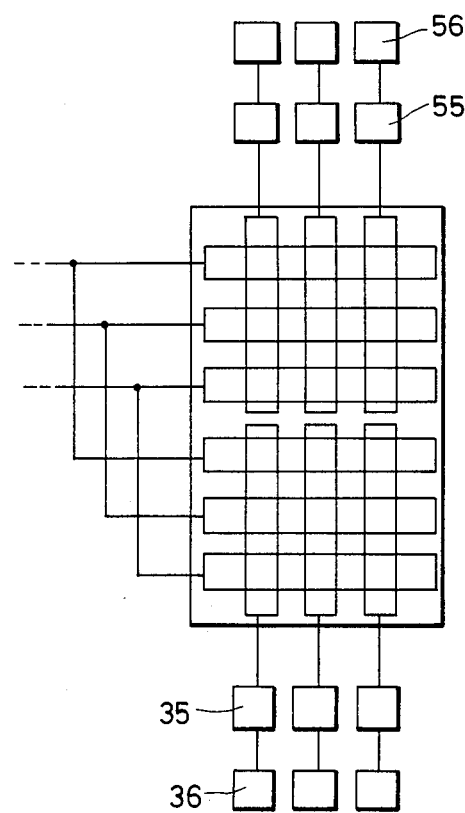

FIG. 21 shows another embodiment of the reading of picture information.

The point of difference from the embodiment of FIG. 19 is that each of the X-electrodes is provided with a current-to-voltage converter circuit 55 and a capacitance discriminating circuit 56 so as to read out capacitances every line. The same effects as in the foregoing are achieved.

EMBODIMENT 10

Figure 22:
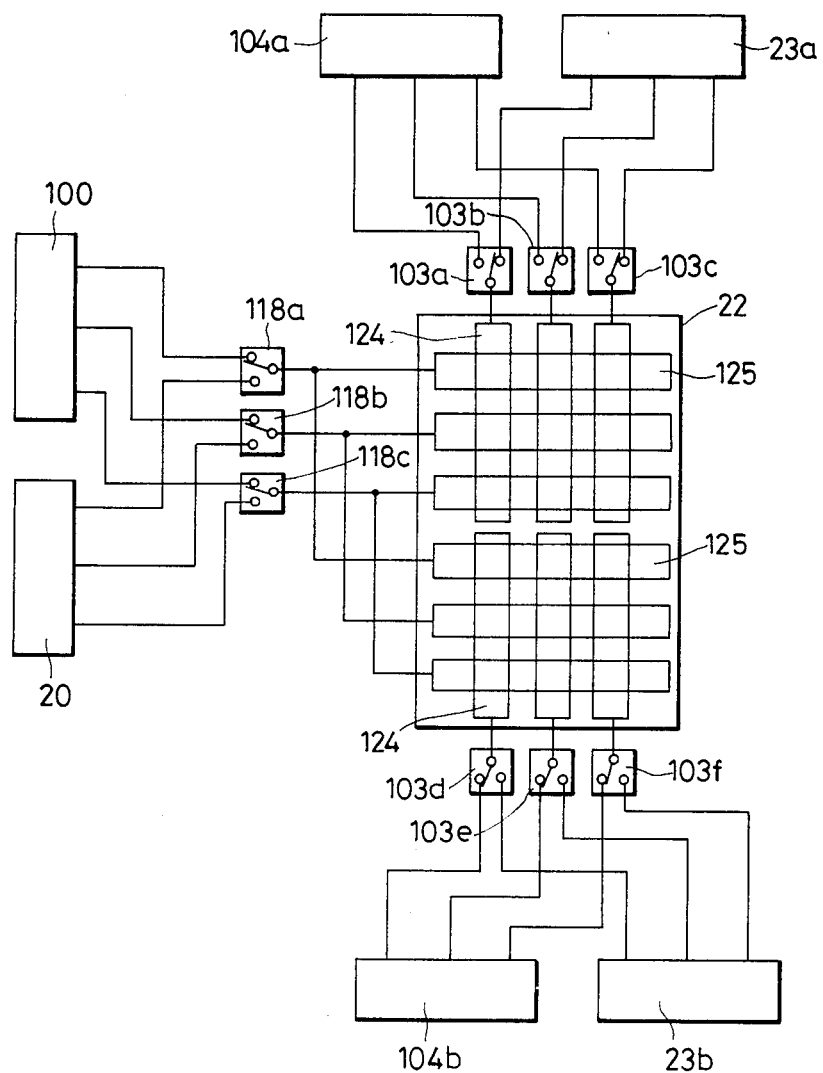
FIGS. 22 to 29 are diagrams showing other embodiments in which the writing and reading of information are unitarily combined.

FIG. 22 shows another embodiment in the case where the information writing and reading circuits are made unitary.

Selector switches 118a–118c are connected to Y-electrodes 125. A write-in scanning circuit 100 is connected to one input terminal of each of the selector switches, while the read-out scanning circuit 20 is connected to the other input terminal.

Further, selector switches 103a–103f are connected to X-electrodes 124. An X-electrode driver circuit 104a or 104b is connected to one input terminal of each of the selector switches, while a picture information detector circuit 23a or 23b is connected to the other input terminal.

Figure 23:
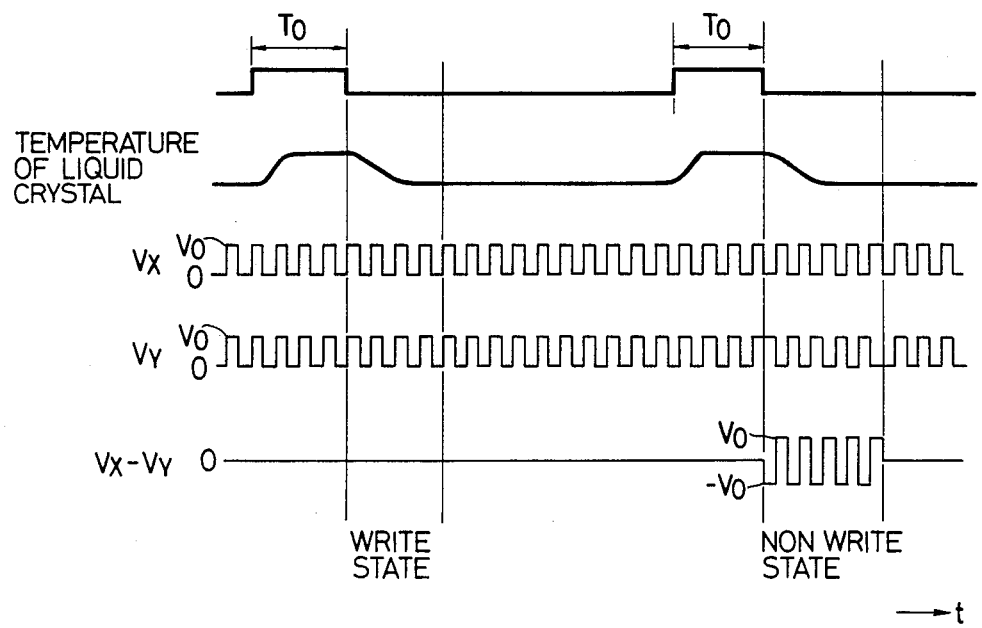

Here, the operation of writing information will be described. FIG. 23 schematically illustrates the processes of the heating and cooling of the smectic liquid crystal and the situations of the applied voltages of the X-electrodes 124 and Y-electrodes 125. At this time, the selector switches 118a–118c shown in FIG. 22 select the write-in scanning circuit 100, and the selector switches 103a–103f select the X-electrode driver circuits 104a, 104b.

When the liquid crystal device is irradiated with a laser beam for a predetermined time $T_o$, the electrodes 124 or 125 generate heat by absorbing the laser beam. As a result, the liquid crystal having the smectic phase is heated to change from this smectic phase into an isotropic liquid phase.

When the laser beam is subsequently removed, the liquid crystal layer is rapidly cooled to change from the isotropic liquid phase into the smectic phase via the nematic phase.

At this time, the voltages $V_X$ and $V_y$ applied to the X-electrodes and Y-electrodes 125 are rendered inphase to being the voltage between both the electrodes into 0 V. Then, liquid crystal molecules are oriented at random with respect to the substrates, so that they scatter external light.

In contrast, when the voltages applied to the X-electrodes and Y-electrodes are rendered antiphase to bring the voltage between both the electrodes into an A.C. voltage of $\pm V_o$, the liquid crystal molecules are oriented substantially perpendicularly to the substrates, so that the liquid crystal device falls into a substantially transparent state.

In this regard, the inventors have acknowledged that the $V_o$ value (threshold voltage) for bringing the liquid crystal device into the substantially transparent state is 3–5 V.

It has also been acknowledged that the liquid crystal device becomes the substantially transparent state when $V_o \gtrsim 50$–60 V is set without heating the liquid crystal having the smectic phase.

EMBODIMENT 11

Figure 24:
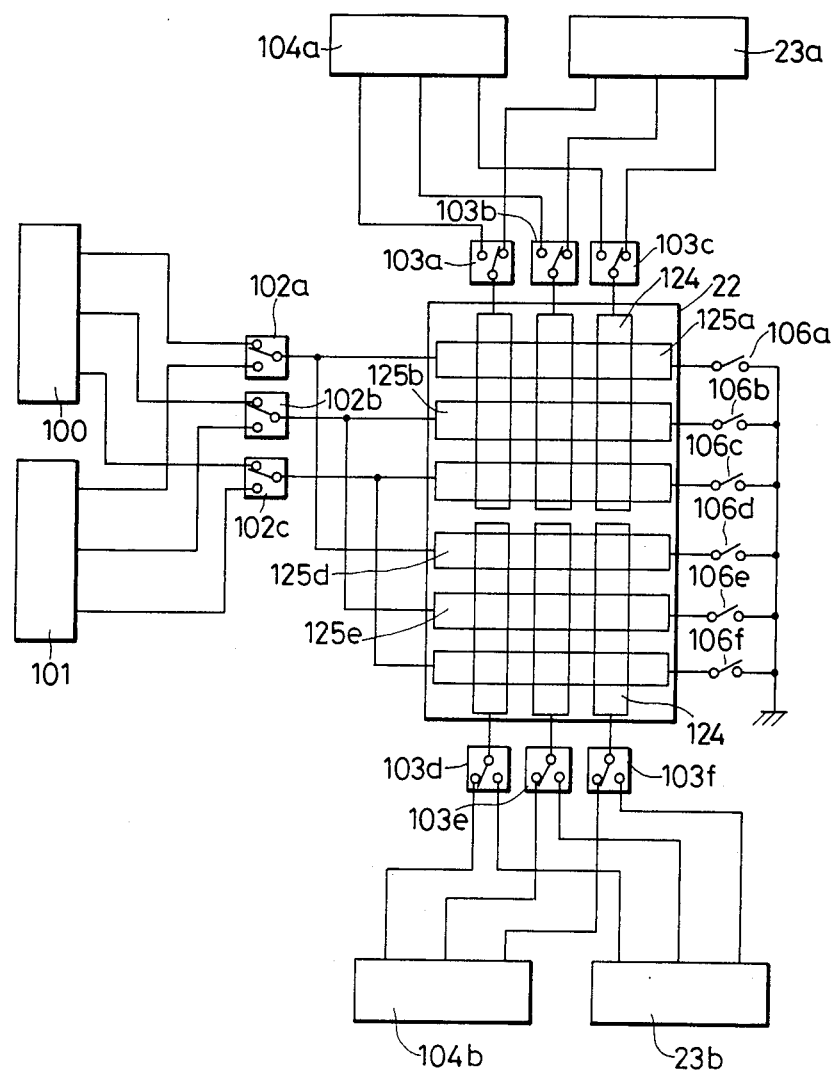

FIG. 24 shows another embodiment in the case of making the information writing and reading circuits unitary. The difference from the embodiment of FIG. 22 lies in the writing operation.

Figure 25:
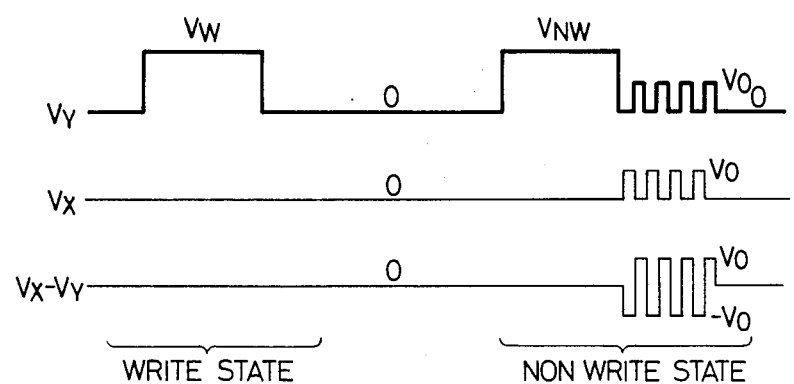

Accordingly, the information writing operation will be briefly explained with reference to FIG. 25.

In order to establish the write state, the selector switches 103a–103f are brought into the open state, and the switch 106a is brought into the "on" state. Here, a heating voltage $V_w$ generated in the write-in scanning circuit 100 is applied to the Y-electrodes 125a and 125d. As a result, the Y-electrodes 125a, 125d are heated and are thereafter cooled rapidly. The liquid crystal having the smectic phase is similarly heated and cooled. When the X- and Y-electrodes are set at a potential, e.g., equal to 0 V in the cooling process, the liquid crystal having the smectic phase falls into the scattering state.

Conversely, in order to establish the non-write state, in the cooling process mentioned above, the switch 106a is brought into the "off" state, whereupon pulses having opposite phases and voltage values of $V_o$ are impressed on the X- and Y-electrodes. Thus, the liquid crystal having the smectic phase becomes the substantially transparent state.

The value of $V_o$ is set so that the liquid crystal having the smectic phase may not be heated to cause a phase change and that the threshold voltage mentioned before may be reached at least.

EMBODIMENT 12

Figure 26:
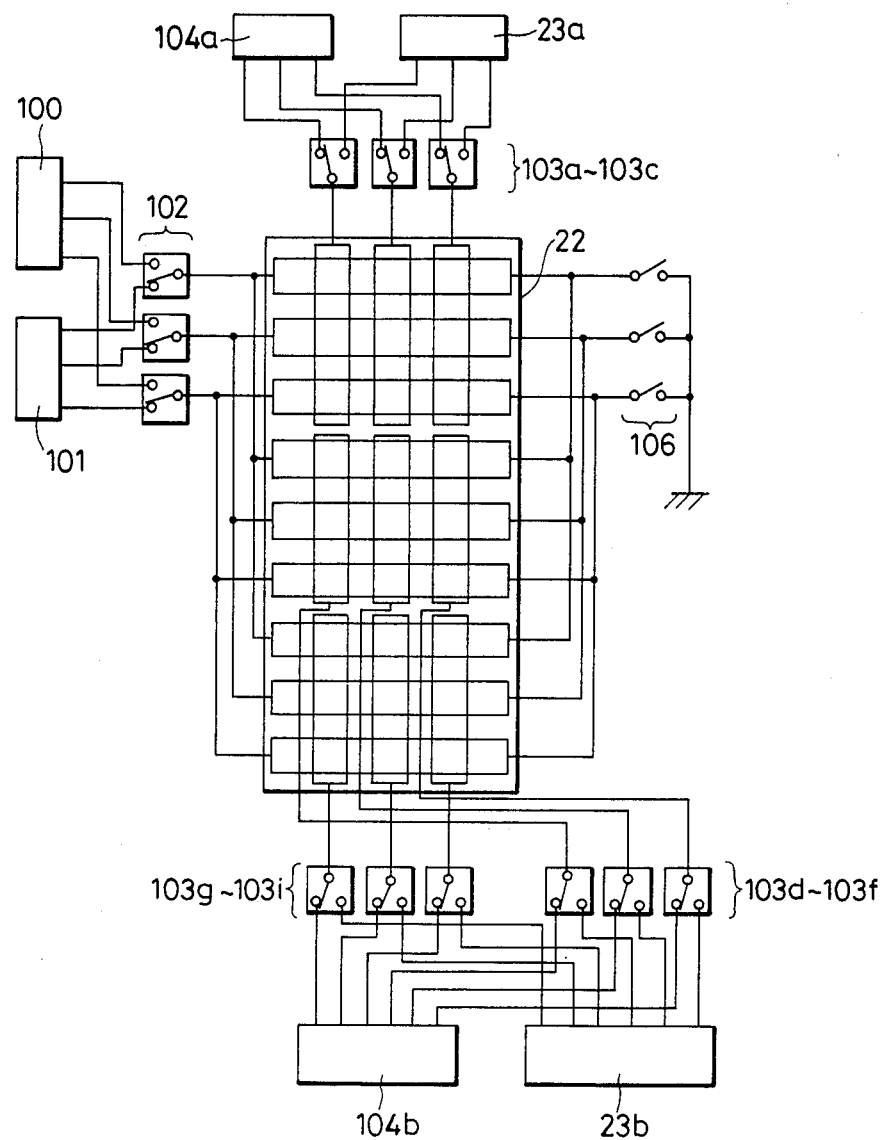

FIG. 26 shows another embodiment in the case of making the information writing and reading circuits unitary.

The write scanning circuit 100, the read scanning circuit 101, the X-electrode driver circuits 104a, 104b and the picture information detector circuits 23a, 23b operate similarly to the respective circuits shown in FIG. 24.

The X-electrodes of a liquid crystal panel 57 are divided into three blocks, and the Y-electrodes of each block are connected in common.

That is, the capacitances of three rows of picture elements are simultaneously detected. Two rows or the three rows are not restrictive, but the capacitances of four or more rows of picture elements may well be simultaneously detected.

EMBODIMENT 13

Figure 27:
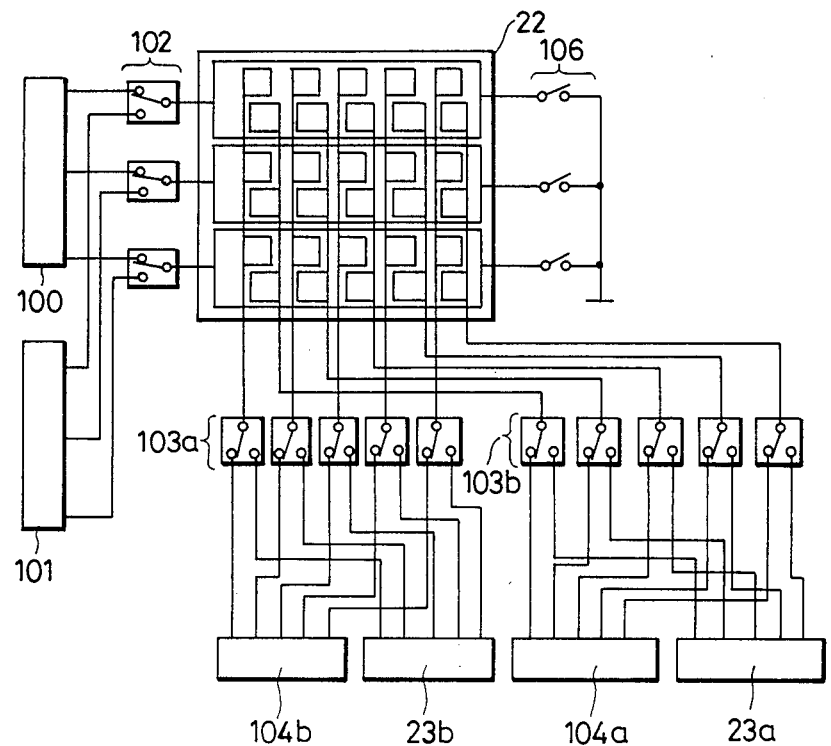

FIG. 27 shows another embodiment in the case where the information writing and reading circuits are made unitary.

The write scanning circuit 100, the read scanning circuit 101, the X-electrode driver circuits 104a, 104b and the picture information detector circuits 23a, 23b perform the same operations as those of the respective circuits shown in FIG. 24.

In the present embodiment, the capacitances of the picture elements of two adjacent rows are simultaneously detected. However, this is not restrictive but the capacitances of the picture elements of three, four, . . . adjacent rows may well be simultaneously detected.

EMBODIMENT 14

Figure 28:
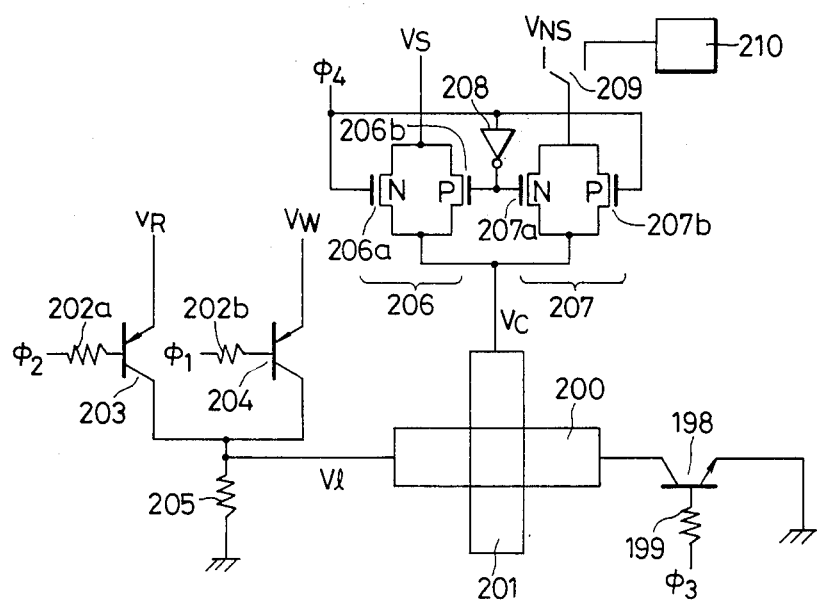

FIG. 28 shows an embodiment of a practicable circuit arrangement in the case where the information writing and reading circuits are made unitary. The collector terminals of PNP transistors 203 and 204 are connected in common, and the node is grounded through a resistor 205. In addition, the node is connected to one end of a Y-electrode 200. In the present embodiment, one picture element will be explained as an example.

The base of the transistor 203 is supplied with a control signal $\phi_2$ through a resistor 202a, and the emitter with a reading voltage $V_R$. Further, the base of the transistor 204 is supplied with a control signal $\phi_1$ through a resistor 202b, and the emitter with a heating voltage $V_W$ for heating the Y-electrode 200.

Connected to the other end of the Y-electrode 200 is the collector of an NPN transistor 198, the emitter of which is grounded. The base of this transistor is supplied with a control signal $\phi_3$ through a resistor 199.

An electronic switch 206 composed of an N-channel MOS transistor 206a and a P-channel MOS transistor 206b, and an electronic switch 207 composed of an N-channel MOS transistor 207a and a P-channel MOS transistor 207b are connected to an X-electrode 201. Further, a selecting voltage $V_S$ is applied to the input terminal of the electronic switch 206, and a switch 209 is connected to the input terminal of the electronic switch 207. A non-selecting voltage $V_{NS}$ is applied to one input terminal of the switch 209, and a current-to-voltage converter circuit 210 is connected to the other input terminal.

Figure 29:
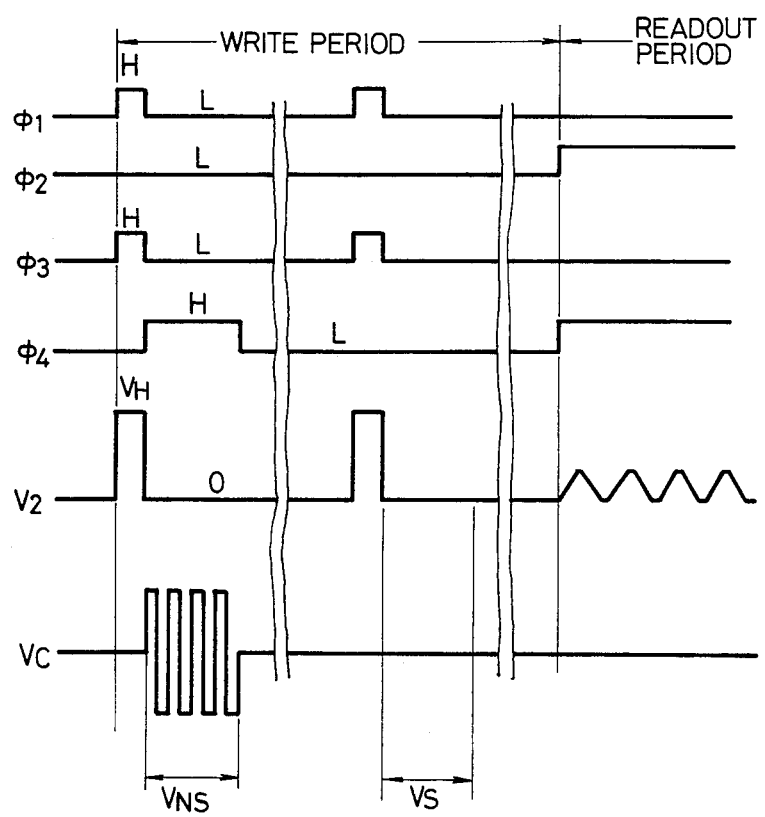

FIG. 29 illustrates the operations of the circuit arrangement shown in FIG. 28.

In writing information into a liquid crystal panel, only the control signals $\phi_1$ and $\phi_3$ are first set at an "H" level. As a result, only the transistors 202b and 198 are turned "on", and the Y-electrode 200 is heated. Subsequently, all the control signals $\phi_1$–$\phi_3$ are set at an "L" level to turn "off" the transistors 204, 203 and 198. In case of bringing the picture element into the non-write state, a control signal $\phi_4$ is set at the "H" level so as to apply the non-selecting voltage $V_{NS}$ to the X-electrode 201, whereas in case of bringing it into the write state, the control signal $\phi_4$ is set at the "L" level so as to apply the selecting voltage $V_S$ to the X-electrode 201.

On the other hand, in reading out information written in the liquid crystal panel, the control signal $\phi_2$ is set at the "H" level to turn "on" the transistor 203. Further, the control signal $\phi_4$ is set at the "H" level to turn "on" the electronic switch 207. The switch 209 is adapted to select the current-to-voltage converter circuit 210 at this time.

As a result, the reading voltage $V_R$ is applied to the Y-electrode 200, and the information reading thus far described is realized.

In any of the embodiments, the cap-citances of a plurality of liquid crystal picture elements can be simultaneously read out, so that an information reading operation at high speed is permitted.

In the present embodiment, the liquid crystal having the smectic phase has been exemplified and explained. As stated before, however, the present invention is applicable to any dielectric, such as a liquid crystal having a cholesteric phase or PLZT, whose capacitance is changed by applying an electric field, heat or the like and is stored without change for a fixed time even after the electric field, the heat or the like has been removed.

The means for changing the capacitances of the dielectrics is not restricted to the heating means, but may be any means adapted to change the capacitances of the dielectrics, such as electric field means or current means.

As the means for detecting the capacitances, besides the method described before in which the displacement currents are detected by applying the time-varying reading voltage, there is, for example, a method in which the changes of impedances are detected by causing currents to flow through picture elements.

When some or all of the electrodes to be formed on the substrates are made of a metal such as Cr or Al, electrode resistances can be lowered, and the rise or fall response time of the displacement current to be detected can be shortened. This is well-suited for fast read-out.

As described above, according to the present invention, an information holding device which is made of a dielectric such as smectic liquid crystal is endowed with the function of reading out information fast in a short time, whereby an information holding device capable of inputting/outputting information can be provided.

We claim:

1. An information holding device comprising a pair of substrates whose opposing surfaces are formed with M electrodes on one side and N electrodes divided into K blocks ($2 \leq L < N/2$) on the other side so that they oppose and that opposing parts between electrodes on the one side and those on the other side may form a matrix as a whole, a dielectric which is held between said pair of substrates and between the opposing parts, the dielectric having a capacitance, means to change the capacitance of the dielectric between at least any desired one of the opposing parts, and K detection means to simultaneously detect the capacitance of the dielectric between the opposing parts of any desired electrode on the one side and any desired electrode of each block on the other side, each of said K detection means including means to apply a voltage varying with time to said dielectric between said at least two opposing parts, and means to simultaneously detect principally displacement currents flowing through said dielectric between said at least two opposing parts.

2. An information holding device according to claim 1, wherein said means to detect the displacement currents comprises a current-to-voltage converter circuit which converts the displacement current into a voltage, and a capacitance discriminating circuit which is constructed of a comparator for comparing the voltage with a reference voltage.

3. An information holding device according to claim 1, wherein the voltage varying with time is a voltage whose dV/dt is constant.

4. An information holding device according to claim 1, wherein the voltage varying with time is a voltage of such an extent of magnitude that the capacitance of said dielectric is scarcely changed.

5. An information holding device according to claim 1, wherein said dielectric is a dielectric whose capacitance is changed when an electric field, heat or the like is applied thereto and is stored without changing for a fixed time even after the electric field, heat or the like is removed therefrom.

6. An information holding device according to claim 5, wherein said dielectric is a liquid crystal which has a smectic phase.

7. An information holding device according to claim 1, wherein said means to change the capacitance of said dielectric is means to heat said dielectric.

8. An information holding device according to claim 1, wherein each block includes a plurality of said N electrodes, and said K detection means enables successive detection of the capacitance of the dielectric between the opposing parts of any desired electrode on the one side and respective electrodes of each block on the other side.

9. An information holding device for at least one of inputting, outputting, and displaying information, comprising:

a pair of substrates having opposing surfaces, one substrate being formed with M plurality of electrodes and the other substrate being formed with N plurality of electrodes divided into K blocks ($2 \leq K \leq N/2$) so that the plurality of electrodes on the respective substrates are in opposition and opposing parts between the opposing electrodes form a matrix as a whole, each block including a plurality of N electrodes;

a dielectric for enabling display of information and being held between said pair of substrates and between the opposing parts, the dielectric having a capacitance;

means to change a capacitance of the dielectric between at least any desired one of the opposing parts; and K detection means for simultaneously detecting the capacitance of the dielectric between the opposing parts of any desired electrode on said one substrate and any desired electrode of each block on said other substrate so as to enable high speed readout of information, each of said K detection means including means to apply a voltage varying with time to said dielectric between said at least two opposing parts, and means to simultaneously detect principally displacement currents flowing through said dielectric between said at least two opposing parts.

10. An information holding device according to claim 9, wherein said K detection means enables successive detection of the capacitance of the dielectric between the opposing parts between any desired electrode on said one substrate and respective electrodes on each block on said other substrate.

* * * * *